United States Patent
Gay et al.

(10) Patent No.: US 8,716,843 B2
(45) Date of Patent: May 6, 2014

(54) MICROELECTRONIC CHIP, COMPONENT CONTAINING SUCH A CHIP AND MANUFACTURING METHOD

(75) Inventors: Laurent Gay, Le Cheylas (FR); Francois Guyader, Montbonnot (FR); Frederic Diette, Bernin (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 45 days.

(21) Appl. No.: 13/455,319

(22) Filed: Apr. 25, 2012

(65) Prior Publication Data
US 2012/0273952 A1 Nov. 1, 2012

(30) Foreign Application Priority Data

Apr. 27, 2011 (FR) ...................................... 11 53616

(51) Int. Cl.
*H01L 23/552* (2006.01)
*H01L 23/52* (2006.01)
*H01L 23/043* (2006.01)
*H01L 23/12* (2006.01)

(52) U.S. Cl.
USPC ........... 257/659; 257/773; 257/775; 257/779; 257/786; 257/708; 257/731

(58) Field of Classification Search
CPC ................... H01L 27/0248; H01L 2224/4846; H01L 2224/02166; H01L 2224/06051; H01L 21/76816; H01L 24/02; H01L 24/05; H01L 24/07; H01L 24/16; H01L 23/5283
USPC .................. 257/708, 659, 773, 775, 779, 786
See application file for complete search history.

(56) References Cited

U.S. PATENT DOCUMENTS

| 5,108,299 | A | | 4/1992 | Cronin |
| 5,514,892 | A | * | 5/1996 | Countryman et al. ........ 257/355 |
| 5,715,127 | A | | 2/1998 | Yu |
| 5,783,868 | A | * | 7/1998 | Galloway ...................... 257/784 |
| 6,921,979 | B2 | * | 7/2005 | Downey et al. ................ 257/773 |
| 7,301,229 | B2 | * | 11/2007 | Yau ............................... 257/700 |
| 7,629,689 | B2 | * | 12/2009 | Maeda ........................... 257/758 |
| 8,134,815 | B2 | * | 3/2012 | Dijkhuis et al. ................. 361/56 |
| 8,183,593 | B2 | * | 5/2012 | Drost et al. .................... 257/173 |
| 2003/0094963 | A1 | | 5/2003 | Fang |
| 2005/0121804 | A1 | | 6/2005 | Kuo et al. |
| 2011/0089540 | A1 | | 4/2011 | Drost et al. |
| 2012/0074540 | A1 | * | 3/2012 | Cho et al. ....................... 257/659 |
| 2012/0292749 | A1 | * | 11/2012 | Pagaila et al. ................. 257/659 |
| 2013/0009278 | A1 | * | 1/2013 | Lee ............................... 257/530 |

FOREIGN PATENT DOCUMENTS

WO WO 01/35462 A1 5/2001

OTHER PUBLICATIONS

French Search Report dated Oct. 13, 2011 from corresponding French Application No. 11/53616.

* cited by examiner

*Primary Examiner* — David Zarneke
(74) *Attorney, Agent, or Firm* — Wolf, Greenfield & Sacks, P.C.

(57) ABSTRACT

Microelectronic chip including a semiconductor substrate; at least one area of its surface which is suitable to be electrically connected to a metal frame designed to accommodate the chip; at least one interconnect area formed by a copper-based conductive layer and comprising a connecting device, the interconnect area being connected to the area by a conductor, wherein the area is formed by a layer forming a copper diffusion barrier inserted between interconnect area and the substrate.

7 Claims, 3 Drawing Sheets

MICROELECTRONIC CHIP, COMPONENT CONTAINING SUCH A CHIP AND MANUFACTURING METHOD

CROSS REFERENCE TO RELATED APPLICATIONS

This application claims the priority benefit of French patent application number 11/53616, filed on Apr. 27, 2011, entitled MICROELECTRONIC CHIP, COMPONENT CONTAINING SUCH A CHIP AND MANUFACTURING METHOD, which is hereby incorporated by reference to the maximum extent allowable by law.

BACKGROUND

Technical Field

Embodiments relate to the field of microelectronics, more especially to layouts intended to reduce the risks associated with electrostatic discharges in electronic components.

Discussion of the Related Art

Generally speaking, electronic components contain an electronic chip that is made of a semiconductor material and includes functional areas. This chip is mounted inside a frame, one of the functions of which is to make it possible to handle the component. This frame forms the exposed part of the component and it is necessary to make provision to dissipate electrical charges that build up during electrostatic discharges, thus avoiding the risk of damage to the chip and, in particular, its functional areas.

To achieve this, one known solution is to electrically connect the frame of the component to the chip via one or more special-purpose areas that are commonly referred to as ESD pads. These special-purpose areas are thus generally positioned around the periphery of the chip, close to the frame. These areas are themselves connected to the chip's interconnect areas which are in turn connected to a fixed external potential via which electrostatic charges can be dissipated.

These interconnect areas accommodate connecting devices that can be of various types such as bumps or posts having an approximately cylindrical shape or use connecting wires that are soldered, firstly, to the interconnect area and, secondly, to a pin of the component.

In certain configurations, the connecting devices are directly mounted on a copper layer without the latter being covered in any specific protective layers.

Electrical connection between the frame and the chip can be established in various ways, in particular by means of an electrically conductive adhesive that is inserted between the metal frame and the special-purpose areas that form the ESD pads.

These special-purpose areas are produced in the same way as the interconnect areas—by depositing a conductive material which is, generally speaking, copper.

SUMMARY

The Applicant noticed that the quality of the electrical contact between the frame and the chip is liable to degrade over time due to possible oxidation on the copper layers that form the special-purpose areas or ESD pads. Such phenomena can be even more harmful because the chip may be assembled on the frame after a significant length of time of as much as several months has elapsed.

Such oxidation phenomena are also difficult to predict accurately because they depend, in particular, on atmospheric conditions during storage.

The need to produce components in which the measured resistance between the frame and the pin used to dissipate electrostatic discharges was as low as possible and as controlled as possible therefore made itself felt.

Thus, according to an embodiment, there is provided a microelectronic chip which comprises:
a semiconductor substrate;
at least one area of its surface which is suitable to be electrically connected to a metal frame designed to accommodate said chip;
at least one interconnect area comprising a copper-based conductive layer and a connecting device, said interconnect area being connected to the area by a conductor,
wherein the visible face of said area comprises a layer suitable for forming a copper diffusion barrier inserted between the interconnect area and the substrate.

Thus, the oxidation phenomena that affect the special-purpose area are reduced thanks to the absence of copper in the interconnect area between the chip and the frame.

Such a chip is suitable for accommodating various types of connecting devices such as bumps or wires that are soldered to the interconnect area.

In practice, the area that forms the ESD pad may, for example, be arranged around the periphery of the chip.

According to another embodiment, the copper diffusion barrier layer may be based on a material chosen from a group comprising titanium nitride, tantalum nitride or titanium/tungsten.

An embodiment also provides an electronic component that contains such a chip, a frame that accommodates the chip and a deformable conductive material inserted between the special-purpose area of the chip and the metal frame.

In practice, the deformable conductive material may also have adhesive properties in order to ensure assembly of the chip and the frame.

Another embodiment also provides a manufacturing method in which an insulating layer and a copper diffusion barrier layer are deposited on a semiconductor substrate, and then a copper layer in order to form an interconnect area in which the copper layer is locally removed in order to expose the layer that forms the copper diffusion barrier layer and define an exposed area that is connected to the interconnect area.

In practice, the copper diffusion barrier layer can be formed by a stack of several elementary layers, part of which is also removed.

According to another embodiment, there is provided a passivation layer in order to define the shapes of said interconnect area and said area.

BRIEF DESCRIPTION OF THE DRAWINGS

Certain embodiments and the resulting advantages will be readily apparent from the description of the following embodiments, reference being made to the accompanying drawings in which.

Figure 1:
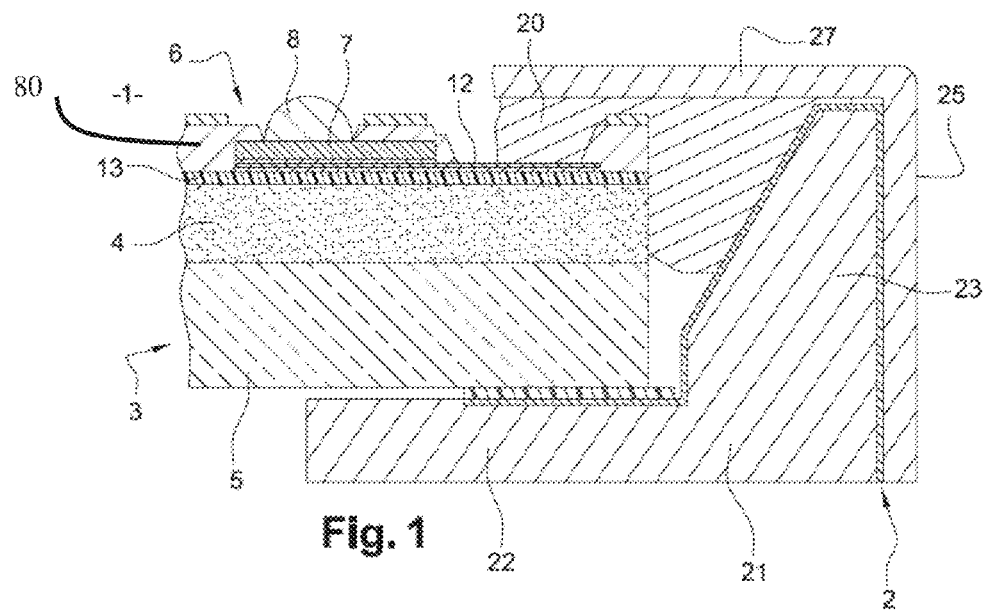
FIG. 1 is a partial cross-sectional view of a component showing assembly of the chip and the frame that accommodates it.

Obviously, the dimensions and proportions indicated in the drawings are indicated only by way of example in order to make the embodiments easier to understand. They may differ from reality and be exaggerated merely for the purpose of showing certain specific aspects.

DETAILED DESCRIPTION

In the example shown in FIG. 1, electronic component 1 comprises a frame 2 in which a chip 3 is fitted. This chip 3 comprises a semiconductor substrate 4 which is associated with another component 5 that acts as a mechanical support or even has other functional roles. It may, for example, be an optical device in the context of realizing an optical sensor. Obviously, the invention covers other component variants that do not necessarily combine various elements with chip 3.

The upper part of semiconductor substrate 4 comprises an interconnect area 6 formed by a conducting layer 7 that is typically made of copper and comprises a connecting device. In the embodiment shown, this connecting device is formed by a conductive metal bump 8 which can be soldered on the printed circuit that will accommodate component 1. This interconnect area is formed inside a window made in passivation layer 80.

Obviously, the embodiments are not confined to only this type of connecting device and also covers variants that use other devices such as, in particular, cylindrical posts or even connecting wires in order to obtain wire-bonding connections.

Figure 2:
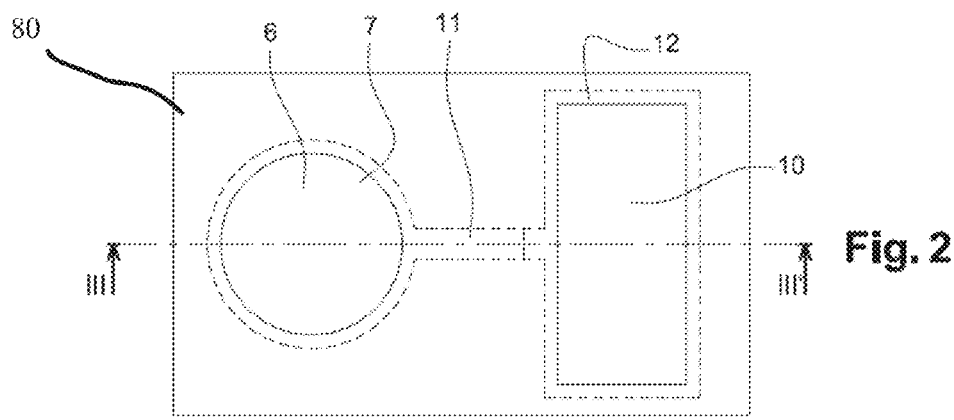
FIG. 2 is a top view of a portion of the chip shown in FIG. 1.

As also apparent in FIG. 2, outside of interconnect areas 6, chip 3 comprises special-purpose areas 10 that are designed to be electrically connected to frame 2, with a view to dissipating electrostatic discharges. These special-purpose areas 10, also referred to as ESD pads are generally located around the periphery of the chip and face, or are close to, the frame. They may extend over a considerable surface area so as to reduce or minimize their resistance. These areas 10 may extend over a significant portion of the periphery of the chip or there may even be several of them located so as to optimize the dissipation of electrostatic discharges.

These special-purpose areas are formed in one of the openings made in passivation layer 80. These special-purpose areas are connected to the interconnect areas by conductors 11 which are covered by the passivation layer. These conductors are conventionally dimensioned so as to allow the flow of currents associated with electrostatic discharges. In the embodiment illustrated, the width of these conductors is markedly less than that of the ESD pad.

Figure 3:
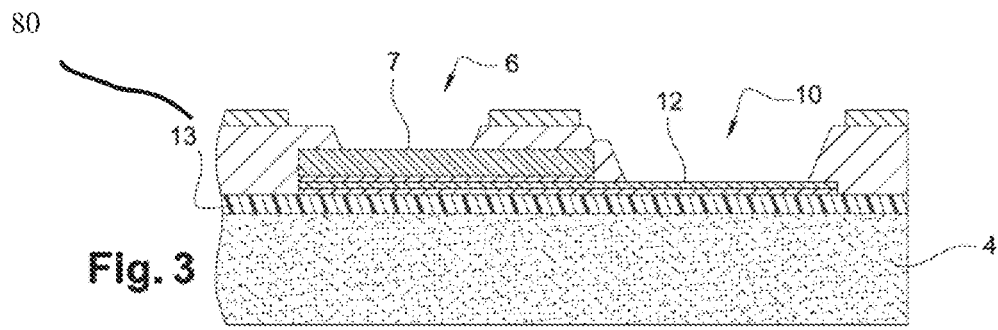
FIG. 3 is a cross-sectional view of the chip shown in FIG. 2 along line III-III'.

As shown in FIGS. 1 and 3, conducting area 6 comprises a copper-based layer 7 that rests on copper diffusion barrier layer 12 which in turn rests on an insulating layer 13 deposited on substrate 4.

According to one aspect of the invention, the special-purpose area forming the ESD pad is realized starting from diffusion barrier layer 12 in the portion thereof that extends laterally as far as the periphery of the chip.

Still referring to FIG. 1, special-purpose area 10 receives a conductive adhesive material 20 which covers it entirely or partially. This conductive material is inserted between chip 3 and frame 2.

In the embodiment shown, frame 2 comprises two main parts, namely a chassis 21 comprising a lower part 22 on which chip 3 rests and a peripheral part 23 that extends laterally so as to form a recess into which the chip is inserted.

In the embodiment shown, this lateral portion 23 has a beveled shape so as to facilitate insertion of the chip and placement of the conductive adhesive material.

In the embodiment shown, frame 2 comprises an additional portion 25 forming a cover which is fitted on the first part 21 of the frame by cooperating with the lateral portion 23 of the frame. This cover has a portion 27 that extends towards the center of the component and partially covers the peripheral portion of chip 3. This portion 27 traps conductive adhesive material 20.

Obviously, this is only one embodiment of a frame; other alternatives can be envisaged in keeping with the spirit of the invention as long as electrical contact is made between chip 3 and frame 2 via a deformable material.

Connection between special-purpose area 10 and interconnect area 6 is obtained, as shown in FIGS. 2 and 3, by a conductor 4 formed by the diffusion barrier layer and by part of the copper layer that forms the interconnect area.

FIGS. 4 to 9 illustrate one particular embodiment of a method used to obtain such a structure.

Figure 4:
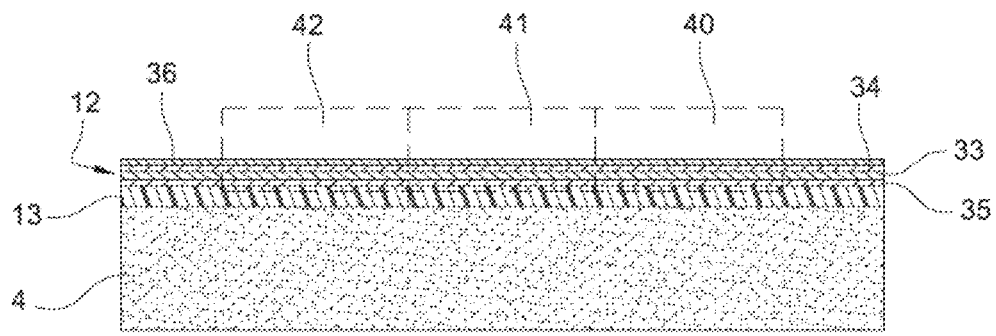
FIGS. 4 to 9 are partial cross-sectional views showing the sequencing of the various steps involved in one manufacturing method according to the invention.

Thus, in FIG. 4, semiconductor substrate 4, including its functional areas which are not shown, is covered in a typically oxide-based insulating layer 13. Obviously, openings are made in this insulating layer in vertically alignment with the functional areas (which are not shown) in order to obtain the various necessary connections.

This oxide layer 13 is topped by a copper diffusion barrier layer which is deposited over the entire substrate by Physical Vapor Deposition (PVD) for example. This copper diffusion barrier layer can be made of different materials that are sufficiently conductive and have sufficient resistance to copper diffusion. Titanium nitride can be used for example.

This barrier layer 12 is deposited in three stages that make it possible to form a titanium layer 35 which allows adhesion to oxide layer 13, then a layer of titanium nitride 33 which is covered in another layer of titanium 34 which adheres to a subsequently deposited copper seed layer.

Other examples of materials that form a copper diffusion barrier can be used, especially tantalum nitride or a tungsten-titanium alloy.

This diffusion barrier layer 12 has a thickness of several hundred nanometers and is then covered in copper seed layer 36 which is also deposited by PVD.

In order to make the invention easier to understand, the dashed line shapes shown in FIG. 4 represent the future locations of special-purpose area or ESD pad 40, interconnect area 42 and conductor 41 which connects them both.

Figure 5:
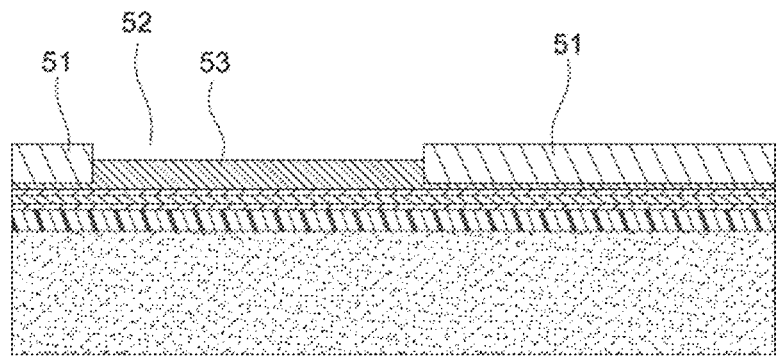

In a subsequent step shown in FIG. 5, photosensitive resin-based mask 51 is produced; it is opened at 52 at the future location of interconnect area 42 and conductor 41 which connects to the ESD pad. Electrolytically grown copper 53 can be used to form the layer that will constitute the future interconnect area and a portion of the conductor that connects to the ESD pad.

Figure 6:
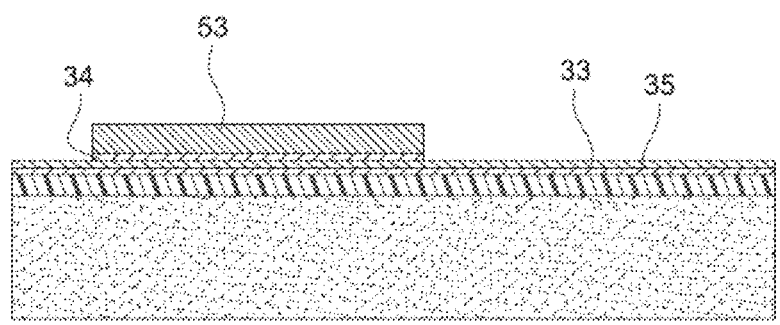

In a subsequent step shown in FIG. 6, photosensitive resin 51 is removed in order to expose the copper layer 53 thus produced. Copper seed layer 36 is then removed by wet etching using Diluted Sulfuric Peroxide (DSP) for instance.

Titanium adhesion layer 34 is then removed by wet etching, typically using hydrofluoric acid, in order to expose titanium nitride layer 33 which forms the copper diffusion barrier.

Obviously, other types of etching can be used to expose the titanium nitride layer.

Figure 7:
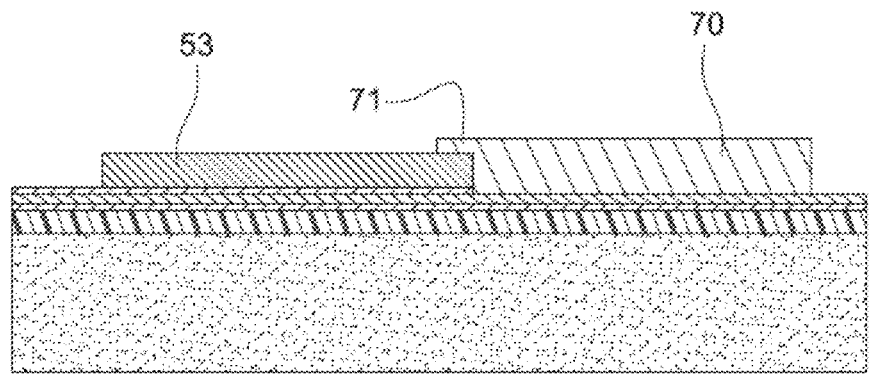

Subsequently, as shown in FIG. 7, a mask 70 based on a photosensitive or similar resin is produced in order to protect titanium nitride layer 33 at the location of the future special-purpose area or ESD pad. This mask 70 advantageously encroaches onto previously deposited copper layer 53 in order to form shoulder 71 in order to firmly attach this protection.

Figure 8:
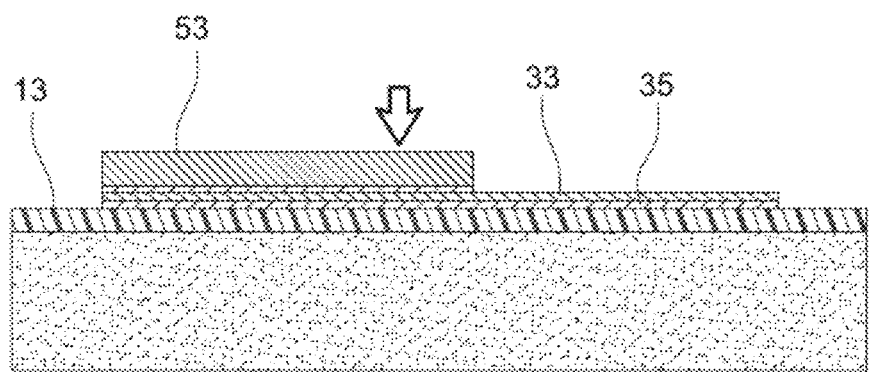

Then, in a step shown in FIG. 8, a wet etching step is performed to remove the exposed areas of the titanium nitride layer using a conventional solution that combines aqueous ammonia and peroxide.

Underlying titanium adhesion layer 35 is then removed by etching using hydrofluoric acid. The photoresist resin is then removed in order to expose titanium nitride layer 33 exclusively in the location that will form the future ESD pad.

Figure 9:
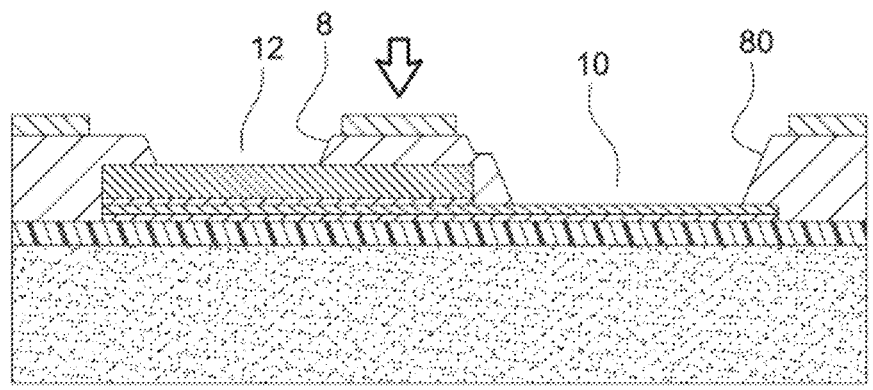

In a final step shown in FIG. 9, a passivation layer 80 is then deposited and, in a subsequent step, openings are made in order to define the shapes of the interconnect area and the shape of the special-purpose area.

Obviously, other additional steps can be added, depending on the technologies used and subsequent processes.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Microelectronic chip comprising:
   a semiconductor substrate;
   at least one area of its surface which is suitable to be electrically connected to a metal frame designed to accommodate said chip;
   at least one interconnect area comprising a copper-based conducting layer and a connecting device, said interconnect area being connected to the said area by a conductor,
   wherein the visible face of said area comprises a layer suitable for forming a copper diffusion barrier inserted between interconnect area and substrate.

2. Chip as claimed in claim 1, wherein connecting device is a bump.

3. Chip as claimed in claim 1, wherein the connecting device is a wire that is soldered to the interconnect area.

4. Chip as claimed in claim 1, wherein said area is arranged around the periphery of the chip.

5. Chip as claimed in claim 1, wherein copper diffusion barrier layer is based on a material chosen from a group comprising titanium nitride, tantalum nitride or titanium/tungsten.

6. Electronic component comprising:
   a chip as claimed in claim 1;
   a frame which accommodates said chip;
   a deformable conductive material that is inserted between said area of chip and metallic frame.

7. Component as claimed in claim 6, wherein deformable conductive material has adhesive properties.

* * * * *